(12) United States Patent
Jelinek et al.

(10) Patent No.: US 12,512,321 B2
(45) Date of Patent: Dec. 30, 2025

(54) METHOD OF MANUFACTURING A SEMICONDUCTOR DEVICE

(71) Applicant: Infineon Technologies AG, Neubiberg (DE)

(72) Inventors: Moriz Jelinek, Villach (AT); Hans-Joachim Schulze, Taufkirchen (DE); Werner Schustereder, Villach (AT); Daniel Schlögl, Villach (AT); Francisco Javier Santos Rodriguez, Villach (AT)

(73) Assignee: Infineon Technologies AG, Neubiberg (DE)

( * ) Notice: Subject to any disclaimer, the term of this patent is extended or adjusted under 35 U.S.C. 154(b) by 391 days.

(21) Appl. No.: 18/127,732

(22) Filed: Mar. 29, 2023

(65) Prior Publication Data

US 2023/0317456 A1 Oct. 5, 2023

(30) Foreign Application Priority Data

Mar. 30, 2022 (DE) .......................... 102022107595.8

(51) Int. Cl.
*H01L 21/265* (2006.01)
*H01L 21/04* (2006.01)
(Continued)

(52) U.S. Cl.
CPC .......... *H01L 21/265* (2013.01); *H01L 21/046* (2013.01); *H01L 21/268* (2013.01);
(Continued)

(58) Field of Classification Search
None
See application file for complete search history.

(56) References Cited

U.S. PATENT DOCUMENTS

2005/0067384 A1* 3/2005 Talwar ............... B23K 26/0604
438/795
2015/0037962 A1* 2/2015 Harada ................. H01L 21/268
438/458

(Continued)

FOREIGN PATENT DOCUMENTS

DE 102015112265 A1 2/2016
DE 102017128247 A1 5/2019

OTHER PUBLICATIONS

Schulze, H.-J., et al., "Reduction of the temperature dependence of leakage current of IGBTs by field-stop design", 2011 IEEE 23rd International Symposium on Power Semiconductor Devices and ICs, San Diego, CA, USA, 2011, pp. 120-123.

*Primary Examiner* — Alexander G Ghyka
(74) *Attorney, Agent, or Firm* — Murphy, Bilak & Homiller, PLLC (57) ABSTRACT

A method of manufacturing a semiconductor device in a semiconductor body having a first surface and a second surface is proposed. Semiconductor device elements are formed in the semiconductor body by processing the semiconductor body at the first surface. A wiring area is formed over the first surface of the semiconductor body. The semiconductor body is attached to a carrier via the wiring area. Thereafter, ions are implanted through the second surface into the semiconductor body. The ions are ions of a doping element, or ions, which induce doping by complex formation, or ions of a heavy metal. A surface region of the semiconductor body at the second surface is irradiated with a plurality of laser pulses. Thereafter, the carrier is removed from the semiconductor body.

17 Claims, 4 Drawing Sheets

(51) Int. Cl.
*H01L 21/268* (2006.01)
*H01L 21/768* (2006.01)
*H01L 21/78* (2006.01)
*H10D 62/85* (2025.01)

(52) U.S. Cl.
CPC ........ *H01L 21/76838* (2013.01); *H01L 21/78* (2013.01); *H10D 62/85* (2025.01)

(56) References Cited

U.S. PATENT DOCUMENTS

| | | |
|---|---|---|
| 2019/0198621 A1 | 6/2019 | Lutz et al. |
| 2019/0371893 A1* | 12/2019 | Iguchi ...................... H10D 8/60 |
| 2021/0225670 A1 | 7/2021 | Mazzamuto |
| 2021/0272797 A1* | 9/2021 | Kodama ............... H10D 12/481 |
| 2023/0077430 A1* | 3/2023 | Hashimoto ............. H01L 21/32 <br> 438/301 |
| 2023/0092013 A1* | 3/2023 | Schulze .............. H01L 21/7806 <br> 257/77 |

* cited by examiner

METHOD OF MANUFACTURING A SEMICONDUCTOR DEVICE

TECHNICAL FIELD

The present disclosure relates to a method of manufacturing a semiconductor device, in particular to a method including processing a semiconductor body at opposite sides of the semiconductor body.

BACKGROUND

Semiconductor wafers are typically available in standard wafer sizes and/or thicknesses. For example, standard wafer diameters may be 2 inch (50 mm), 4 inch (100 mm), 6 inch (150 mm), or 8 inch (200 mm), or even larger. For example, in power semiconductor devices with a vertical load current flow between a front side and a back side of a chip or die, the wafers are processed at the front side and at the back side. Processing wafers at the front side and the back side typically has to meet many, partially conflicting, requirements for meeting demands on chip reliability. For example, requirements on doping profiles introduced through one side, e.g. the back side, of the wafer may be in conflict with thermal budget constraints caused by previous processing of the wafer at the other side, e.g. the front side. Likewise, requirements on area specific on-state resistance may be in conflict with mechanical stability of the wafers during semiconductor processing.

Thus, there is a need for improving flexibility of manufacturing a semiconductor device.

SUMMARY

An example of the present disclosure relates to a method of manufacturing a semiconductor device in a semiconductor body having a first surface and a second surface. The method includes forming semiconductor device elements in the semiconductor body by processing the semiconductor body at the first surface. The method further includes forming a wiring area over the first surface of the semiconductor body. The method further includes attaching the semiconductor body to a carrier via the wiring area. Thereafter, the method further includes implanting ions through the second surface into the semiconductor body. The ions are ions of a doping element, or ions, which induce doping by complex formation, or ions of a heavy metal. The method further includes irradiating a surface region of the semiconductor body at the second surface with a plurality of laser pulses. Thereafter, the method further includes removing the carrier from the semiconductor body.

Another example relates to a semiconductor device. The semiconductor device includes a semiconductor body having a first surface and a second surface. The semiconductor device further includes semiconductor device elements in the semiconductor body at the first surface. The semiconductor device further includes a wiring area over the first surface of the semiconductor body. The semiconductor body further includes an impurity in the semiconductor body which acts as donor or acceptor or as recombination center. A profile of concentration of the impurity has a penetration depth from the second surface into the semiconductor body along a vertical direction. The profile of concentration has a concentration plateau along a vertical segment ranging from 30% to 70% of the penetration depth. The plateau has a fluctuation of the concentration of less than 20%.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of manufacturing semiconductor devices and together with the description serve to explain principles of the examples. Further examples are described in the following detailed description and the claims.

DETAILED DESCRIPTION

In the following detailed description, reference is made to the accompanying drawings, which form a part hereof and in which are shown by way of illustrations specific examples of manufacturing semiconductor devices. It is to be understood that other examples may be utilized and structural or logical changes may be made without departing from the scope of the present disclosure. For example, features illustrated or described for one example can be used in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

Ranges given for physical dimensions include the boundary values. For example, a range for a parameter y from a to b reads as a y b. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of a method of manufacturing a semiconductor device in a semiconductor body having a first surface and a second surface may include forming semiconductor device elements in the semiconductor body by processing the semiconductor body at the first surface. The method may further include forming a wiring area over the first surface of the semiconductor body. The method may further include attaching the semiconductor body to a carrier via the wiring area. Thereafter, the method further may include implanting ions through the second surface into the semiconductor body. The ions may be ions of a doping element, or ions, which induce doping by complex formation, or ions of a heavy metal acting as recombination center. The method may further include irradiating a surface region of the semiconductor body at the second surface with a plurality of laser pulses. Thereafter, the method may further include removing the carrier from the semiconductor body.

The semiconductor device may be an integrated circuit, or a discrete semiconductor device or a semiconductor module, for example. The semiconductor device may be or may include a power semiconductor device, e.g. a vertical power semiconductor device having a load current flow between the first surface and the second surface. The semiconductor device may be used in automotive, industrial power control, power management, sensing solutions and security in Internet of Things applications The semiconductor device may be or may include a power semiconductor diode, or a power semiconductor IGBT (insulated gate bipolar transistor), or a reverse conducting (RC) IGBT, or a power semiconductor transistor such as a power semiconductor IGFET (insulated gate field effect transistor, e.g. a metal oxide semiconductor field effect transistor). The power semiconductor device may be configured to conduct currents of more than 1 A or more than 10 A or even more than 30 A. For realizing a desired maximum load current, the semiconductor device may be designed by a plurality of parallel-connected cells. The parallel-connected cells may, for example, be transistor or diode cells formed in the shape of a strip or a strip segment. Of course, the device cells can also have any other shape, e.g., circular, elliptical, polygonal such as octahedral. The semiconductor device may be further configured to block voltages between load terminals, e.g. between emitter and collector of an IGBT, or between cathode and anode of a diode, or between drain and source of a MOSFET, in the range of several tens, or several hundreds or up to several thousands of volts, e.g. 30V, 40V, 60V, 80V, 100V, 400 V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the power semiconductor device, for example. The semiconductor device may also be or may also include a lateral semiconductor device, e.g. a lateral power semiconductor device, having a load current flow along a lateral direction, e.g. parallel to the first surface.

For example, the semiconductor device may be implemented monolithically using a mixed technology. Such mixed technologies can be used, for example, to form analog circuit blocks in a chip by the bipolar devices included in this technology for providing interfaces to digital systems, and to form digital circuit blocks by the complementary metal-oxide-semiconductor (CMOS) devices included in this technology for providing signal processing, and to form low-, medium- or high-voltage or power blocks by field effect transistors included in this technology. Such mixed technologies are known, for example, as bipolar CMOS-DMOS, BCD technologies or smart power technologies, SPT, and are used in a variety of application areas in the field of e.g. lighting, motor control, automotive electronics, power management for mobile devices, audio amplifiers, power supply, hard disks, printers. The semiconductor device may be part of a discrete, BCD or Smart Power chip in one of the above application fields, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride 5 (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a magnetic Czochralski, MCZ, or a float zone (FZ) or an epitaxially deposited silicon semiconductor body.

The first surface may be a front surface or a top surface of the semiconductor body, and the second surface may be a back surface or a rear surface of the semiconductor body, for example. The semiconductor body may be attached to a lead frame via the second surface, for example. Over the first surface of the semiconductor body, interconnects may be arranged on a contact pad structure of a wiring area for electrically connecting device elements in the semiconductor body to elements, e.g. other semiconductor devices, outside of the semiconductor device, for example.

Forming semiconductor device elements in the semiconductor body by processing the semiconductor body at the first surface may include at least one doping process for forming doped regions in the semiconductor body. The at least one doping process may include an ion implantation process followed by a thermal activation of dopants, a diffusion process introducing the dopants into the semiconductor from a dopant source (e.g. solid or gaseous diffusion source), an in-situ doping process when forming a semiconductor layer, e.g. by a layer deposition process, on a semiconductor substrate, e.g. wafer, of the semiconductor body. The exemplary doping processes may be combined in any way and may be repeated in any way, e.g. depending on a desired number and profile of the doped regions that are to be formed in the semiconductor body at the first surface.

Exemplary doped regions are source and drain regions, or emitter and collector regions, body region(s), body contact region(s), current spread region(s), shielding region(s) configured to shield a gate dielectric from high electric fields, field stop region(s). Forming semiconductor device elements in the semiconductor body by processing the semiconductor body at the first surface may also include trench etch processes. The trench etch processes may be used to form trenches such as gate electrode trenches, field electrode trenches, multi-electrode trenches (e.g. combining gate and field electrodes in one trench), trenches for edge termination structures, contact trenches for providing an electric contact to doped regions in the semiconductor body. Forming semiconductor device elements in the semiconductor body by processing the semiconductor body at the first surface may also include forming insulating layer(s), conductive layer(s), or any combination thereof, in the trenches. Exemplary insulating or conductive layers include, inter alia, gate or field electrodes by doped semiconductor layers (e.g. doped polycrystalline silicon, or metal, or metal alloy), oxide layers (e.g. silicate glass, deposited $SiO_2$, thermal $SiO_2$), nitride layers (e.g., $Si_3N_4$), high-k dielectric layers, low-k dielectric layers, dielectric spacers, or any combination thereof.

Forming a wiring area over the first surface of the semiconductor body may include forming one or more than one, e.g. two, three, four or even more wiring levels. Each wiring level may be formed by a single one or a stack of conductive layers, e.g. metal layer(s). For example, the wiring levels may include at least one of Cu, Au, AlCu, Ag, or alloys thereof. The wiring levels may be lithographically patterned, for example. Between stacked wiring levels, an interlayer dielectric structure may be formed. Openings may be formed in the interlayer dielectric structure for electrically interconnecting different wiring layers. For example, contact plug(s), or contact via(s) or contact line(s) may be formed in the openings in the interlayer dielectric structure to electrically connect parts, e.g. metal lines or contact areas, of different wiring levels to one another.

The wiring area may be arranged over an active area of the semiconductor body. The active area may be an area where the device elements in the semiconductor body, e.g. a transistor or diode cell array of a vertical power semiconductor device (e.g. a power IGBT, a power MOSFET, a power thyristor, or a power diode), are electrically connected to the wiring area via the first surface. Apart from the active area, the semiconductor device may also include an edge termination area that at least partly surrounds the active area. The edge termination area may include a termination structure. In a blocking mode or in a reverse biased mode of the semiconductor device, the blocking voltage between the active area and a field-free region laterally drops across the termination structure. The termination structure may have a higher or a slightly lower voltage blocking capability than the active area. The termination structure may include a junction termination extension (JTE) with or without a variation of lateral doping (VLD), one or more laterally separated guard rings, or any combination thereof, for example. The wiring area may laterally adjoin to a passivation area that may be arranged over the edge termination area of a vertical power semiconductor device, for example. An imide passivation may be arranged over the edge termination and/or wiring area, for example.

The carrier may be a reversible carrier that can be attached to and detached from the wiring area of the semiconductor body. In other words, when detaching the carrier from the wiring area, the carrier may be reused as a carrier for another attachment process, for example. The carrier may be attached to the wiring area of the semiconductor device by any process that allows for a detachment process, for example. For example, the carrier may be a glass carrier.

The ions implanted through the second surface into the semiconductor body may be ions of a doping element, or ions, which induce doping by complex formation. An example of an ion which induces doping by complex formation is a proton. Proton implantation may be used to generate hydrogen-related donors in the semiconductor body, e.g. silicon. A complex that may be electrically activated, e.g. by thermal annealing, as a dopant is a hydrogen-vacancy complex, for example. For adjusting a minority lifetime in the semiconductor body or a part thereof, ions of a heavy metal may be implanted into the semiconductor body, for example.

The method may further include removing the carrier from the semiconductor body.

When irradiating a surface region of the semiconductor body at the second surface with a plurality of laser pulses, the plurality of laser pulses may be irradiated on the second surface of the semiconductor body without altering a lateral position between a whole laser apparatus relative to the semiconductor body, e.g. wafer. In other words, the semiconductor body may not be moved relative to the laser apparatus between the plurality of laser pulses that are applied to the surface region at the second surface of the semiconductor body, for example. Therefore, the semiconductor body may remain in a fixed pose relative to non-movable parts of the laser apparatus. A laser unit of the laser apparatus on the other hand may scan over the second surface of the semiconductor body. By adjusting parameters of the laser irradiation process, e.g. number of laser pulses, energy of laser pulses, repetition rate, and by varying the parameters during the laser irradiation process of a specific surface region of the semiconductor body at the second surface, temperature profiles in the semiconductor body may be adapted to specific requirements. Thereby, diffusion of implanted elements (e.g. dopants or life-time killing elements) may be adjusted by the laser irradiation process. This may also allow for realizing deep doping profiles, e.g. field stop regions or emitter regions. Likewise, electric activation may be adjusted by the laser irradiation process. Moreover, ion implantation energies may be reduced for realizing a specific profile since the temperature profile adjusted by the laser irradiation process may enlarge the penetration depths of the implanted elements by thermal diffusion, for example, whereby a critical enhanced temperature in the region of the non-laser-irradiated surface will not be exceeded by realizing a sufficiently steep gradient of the temperature profile. A typical maximum allowed temperature at the other wafer side may be 400° C. for example or even better 300° C.

By combining the reversible carrier process with the laser irradiation process as described above, flexibility of manufacturing a semiconductor device may be increased by lowering hurdles in processing a semiconductor body that are caused by preceding processes carried out to the semiconductor body.

For example, the method may further include reducing a thickness of the semiconductor body after attaching the semiconductor body to the carrier and before implanting the ions through the second surface into the semiconductor body. For example, the thickness of the semiconductor body may be reduced by any or any combination of mechanical processing (e.g. grinding), chemical processing (e.g. etching), splitting methods that divide the semiconductor body into a first parent substrate portion (device substrate) and a second parent substrate portion (reclaim substrate).

For example, the method may further include forming a metal contact on the second surface of the semiconductor body after irradiating the surface region of the semiconductor body at the second surface with the plurality of laser pulses. The metal contact may be formed with the carrier being attached to the semiconductor body, for example. For the case that the formation of a metal silicide is required, such a laser process can be also performed after the metal deposition.

For example, the ions may be protons. The protons may be electrically activated as hydrogen-related donors that are based on a hydrogen-vacancy complex; further atoms such as oxygen and carbon may also be involved in such a donor-like complex formation. The plurality of laser pulses or part thereof may provide the thermal budget or part of the thermal budget that is required for electrically activating the hydrogen-related donor doping. Thermal activation of the donors induced by the implanted protons and the related formed complexes by the plurality of laser pulses or part thereof may be carried out with the carrier being attached to the semiconductor body via the wiring area, for example. This process enables a higher flexibility in respect to the proper selection of the activation of the proton-induced field stop zone, because due to the application of this method with a well-defined temperature gradient a higher activation temperature for the activation of this field stop region can be chosen without a critical increase of the temperature of the wafer in the region of the non-irradiated other wafer surface. For the case of a typically applied furnace process the annealing temperature is limited to a maximum temperature of 400° C. For the case of higher annealing temperatures, for example between 420° C. and 480° C. or between 440° C. and 470° C., in the field stop region a higher minority carrier lifetime and a higher mobility of free charge carriers can be realized resulting in lower on-state losses.

For example, a temperature gradient between the first surface and the second surface may be enforced during the process step of irradiating the second surface. The temperature gradient may be dependent on the thermal conduction within the semiconductor body and the parameters of the irradiation of the second surface. This temperature gradient may be kept stable for a time period of at least 1 second, at least 2 seconds, at least 5 seconds, or even 10 seconds. For example, the parameters for said irradiation may be chosen to induce a steady-state of the temperature distribution within the semiconductor body for at least the above-mentioned time period. A maximum of the temperature at the first surface may be limited to at most 200° C., or at most 180° C., or at most 150° C. This ensures, that the carrier is not overheated during the processing of the semiconductor body at the second surface. A temperature at the second surface may be greater than 350° C., for example in a range from 370° C. to 540° C. or in a range from 420° C. to 520° C.

For example, the parameters of the plurality of laser pulses are chosen to achieve a temperature of at least 350° C. in a depth of at least 0.5 µm, in a depth of at least 1 µm, or in a depth of at least 2 µm. For example, a maximum of the temperature at the first surface may be limited to at most 200° C., or at most 180° C., or at most 150° C., simultaneously. Such a temperature distribution within the semiconductor body may only be achieved with using multiple laser pulses, e.g. more than 10 or even more than 50 laser pulses, instead of only one pulse. Using such a temperature distribution allows the activation of dopants to a depth of up to 0.5 µm or up to 1 µm or even up to 2 µm from the second surface 106 while the semiconductor body 102 is attached to a carrier 112, e.g. via the first surface 104.

For example, the ions may be at least one of selenium, sulfur, phosphorus, boron, aluminum, gallium, or indium. The plurality of laser pulses or part thereof may provide the thermal budget or part of the thermal budget that is required for electrically activating the implanted ions as dopants and effecting an in-diffusion of these dopants. For example, the ions may be implanted for forming a field stop region, or an emitter region at a rear side of the semiconductor device, e.g. an IGBT. Proton implantation as described above may also be combined with ion implantation of at least one of selenium, sulfur, phosphorus, boron, aluminum, gallium, or indium. Moreover, the thermal budget applied by the plurality of laser pulses or part thereof may be concurrently used for electrically activating doping by protons and by the at least one of selenium, sulfur, phosphorus, boron, aluminum, gallium, or indium, for example. Thermal activation of the at least one of implanted selenium, sulfur, phosphorus, boron, aluminum, gallium, or indium may be carried out with the carrier being attached to the semiconductor body via the wiring area, for example.

For example, the ions may be at least one of platinum, palladium, or gold. The plurality of laser pulses or part thereof may provide the thermal budget or part of the thermal budget that is required for electrically activating and in-diffusing the at least one of platinum, palladium, or gold as a recombination center for reducing the minority carrier lifetime. For example, ion implantation of at least one of platinum, palladium, or gold may be combined with ion implantation of at least one of protons, selenium, sulfur, phosphorus, boron, aluminum, gallium, or indium. Moreover, the thermal budget applied by the plurality of laser pulses or part thereof may be concurrently used for electrically activating doping by protons, selenium, sulfur, phosphorus, boron, aluminum, gallium, or indium, for example.

For example, the at least one of platinum, palladium, or gold may be implanted through the second surface using a patterned ion implantation mask on the second surface. This may allow for a variation of the minority carrier lifetime along a lateral direction of the semiconductor body. Electric activation and diffusion of the at least one of platinum, palladium, or gold may be caused by the thermal budget introduced by the plurality of laser pulses. The thermal budget, e.g. the spatial and temporal distribution of temperature within the semiconductor body in an area close to the second surface, e.g. within a range of some micrometers, may be adjusted by the laser processing parameters so that the minority carrier lifetime limited by the at least one of platinum, palladium, or gold may be set to different values in different areas at the second surface. By using several ion implantation masks or tilted ion implantations through mask openings having different widths, a pattern of regions may be formed in the semiconductor body that differ from one another with respect to minority carrier lifetime, for example. This allows additional degrees of freedom for controlling the plasma in the drift region of bipolar devices, such as diodes, IGBT, or RC-IGBT. In RC-IGBTs the instruction of the above-mentioned elements may be constricted to diode area(s). The proposed method allows a better controllability of diffusion processes of said elements.

For example, the carrier may be an organic, inorganic, or hybrid material, and may be attached to the semiconductor body via the wiring area by at least one of electrostatic force, adhesive force, or magnetic force.

For example, the carrier may be removed from the semiconductor body by at least one of chemical soaking, chemical dissolving, temperature, electromagnetic radiation, mechanical, magnetic, or electric forces.

For example, a metal contact may be formed on the second surface before or after removing the carrier from the semiconductor body. The processing sequence may depend, for example, on the mechanical stability of the semiconductor body during processing, e.g. on a thickness, material and diameter of the semiconductor body, e.g. wafer, during processing.

For example, the plurality of laser pulses may be applied such that that thermal equilibrium is not reached in the irradiated semiconductor body during pulse off-mode meaning a subsequent laser pulse is following the previous pulse within a time period being shorter than the typical thermal relaxation time due to the thermal diffusivity of the semiconductor body. For example, at least some of the plurality of laser pulses differ by at least one of pulse duration, pulse energy density, pulse repetition rate. For example, a number of laser pulses that each lateral location (e.g. each grid point for scanning with the laser over the second surface) on the semiconductor body is exposed to may range from 150 to 15000. For example, the laser pulses may be irradiated on the surface region of the semiconductor body at the second surface for an irradiation period ranging from 1 to 100. For example, the pulse energy density of at least some of the plurality of laser pulses may range from 4 mJ/cm² to 40 mJ/cm². For example, the pulse duration of at least some of the plurality of laser pulses may range from 0.1 ns to 10 ns. In another example, longer laser pulses may be used, for example in a range from 0.1 ns to 100 ns. For example, the pulse repetition rate of at least some of the plurality of laser pulses may range from 20 MHz to 200 MHz. By adjusting the irradiation parameters, e.g. pulse energy, pulse duration, or pulse repetition rate, the laser pulses may be non-melting the semiconductor body at the second surface, or may be melting the semiconductor body at the second surface. By varying the pulse energy, pulses of a first group of shots may be non-melting and pulses of a second group of shots may be melting the semiconductor body at the second surface, for example. This defines a two-step procedure with either the first group following the second group or the second group following the first group. In another example, none of the laser pulses may be melting the semiconductor body at the second surface. In yet another example, all pulses may be melting the semiconductor body at the second surface. By varying the laser irradiation parameters during the irradiation period of the semiconductor region at the second surface of the semiconductor body, a temporal temperature distribution in the semiconductor body close to the second surface may be adjusted such that that the implanted ions or part thereof are electrically activated and thermal diffusion of the implanted ions by the thermal budget results in a target concentration profile of the implanted ions.

For example, the semiconductor body may be a wafer having a diameter equal to or larger than 200 mm. The method further may further include dicing the semiconductor body 102 into dies. For example, the wafer may be a FZ (Float Zone) silicon wafer, or a CZ (Czochralski) silicon wafer (e.g. a magnetic CZ silicon wafer).

Another example relates to a semiconductor device. The semiconductor device may be manufactured by the exemplary methods described above. The semiconductor device may include a semiconductor body having a first surface and a second surface. The semiconductor device may include semiconductor device elements in the semiconductor body at the first surface. The semiconductor device may further include a wiring area over the first surface of the semiconductor body. The semiconductor body may further include an impurity in the semiconductor body. A profile of concentration of the impurity has a penetration depth from the second surface into the semiconductor body along a vertical direction. The profile of concentration may have a concentration plateau along a vertical segment ranging from 30% to 70% of the penetration depth. The plateau may have a fluctuation of the concentration of less than 20%, or less than 15%, or less than 10%. The penetration depth may be a vertical distance to the second surface where the concentration is two orders or three orders of magnitude smaller than, i.e. amounts to 1% or 0.1% of, an average concentration of the plateau, for example.

For example, the impurity may be one of hydrogen-related donors, selenium, sulfur, phosphorus, boron, aluminum, gallium, indium, platinum, palladium, or gold.

For example, the penetration depth may range from 500 nm to 5 µm, or from 1 µm to 3 µm.

For example, the quotient of a net doping concentration and a minority carrier lifetime may increase, in the plateau, with increasing vertical distance to the second surface which is caused by less effective annealing of irradiation-induced defects, such as double vacancies or vacancy-oxygen complexes or other higher-order defect complexes, in deeper wafer regions where the annealing temperature is lower. Likewise, the quotient of a net doping concentration and a charge carrier mobility, e.g. majority carrier mobility (e.g. holes or electron mobility), may increase, in the plateau, with increasing vertical distance to the second surface. The same trend may, alternatively or additionally, be valid in the wafer areas located in a larger depth than the plateau region. In other words, the quotient of a net doping concentration and a minority carrier lifetime may optionally increase, deeper than the plateau or below the plateau, with increasing vertical distance to the second surface. The quotient of the net doping concentration and a minority carrier lifetime may optionally increase, in a deep region deeper than the plateau or below the plateau, with increasing vertical distance to the second surface, wherein said deep region may directly adjoin the plateau region.

The examples and features described above and below may be combined. Functional and structural details (e.g. materials, dimensions) described with respect to the examples above shall likewise apply to the examples illustrated in the figures and described further below.

FIGS. 1A to 1F are schematic cross-sectional views for illustrating process features of a method of manufacturing a semiconductor device.

Figure 1A:
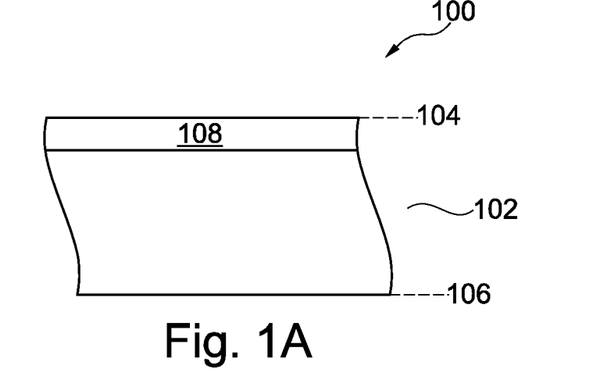
FIGS. 1A to 1F are schematic cross-sectional views for illustrating process features of manufacturing a semiconductor device.

Referring to the schematic cross-sectional view of FIG. 1A, semiconductor device elements are formed in a semiconductor body 102 by processing the semiconductor body 102 at a first surface 104. The first surface 104 is a front surface that is opposite to a second surface 106, e.g. rear or back surface. In the schematic cross-sectional view of FIG. 1A, the semiconductor device elements are illustrated in a simplified manner by reference symbol 108 identifying the region where the device elements are formed.

Figure 1B:
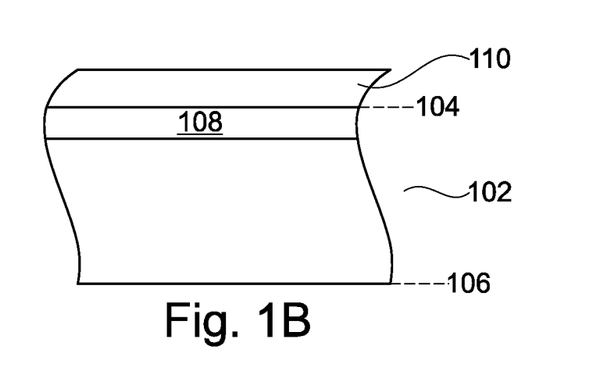

Referring to the schematic cross-sectional view of FIG. 1B, a wiring area 110 is formed over the first surface 104 of the semiconductor body 102. The wiring area 110 may laterally adjoin to a passivation area that may be arranged over an edge termination area of a vertical power semiconductor device, for example (not illustrated in FIG. 1B). An imide passivation may be arranged over the wiring area, for example.

Figure 1C:
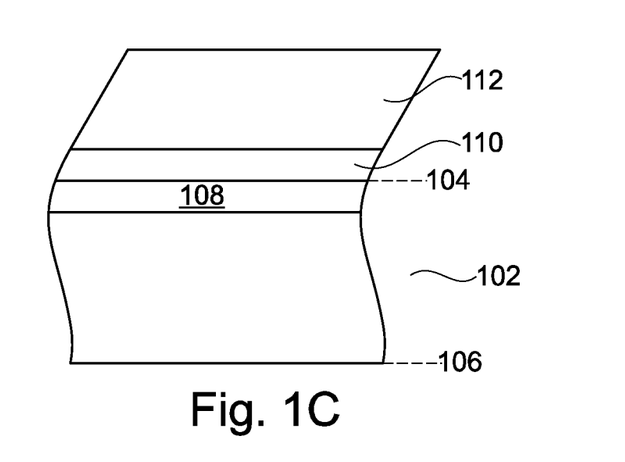

Referring to the schematic cross-sectional view of FIG. 1C, a carrier 112 is attached to the semiconductor body 102 via a side of the semiconductor body where the wiring area 110 is located.

Figure 1D:
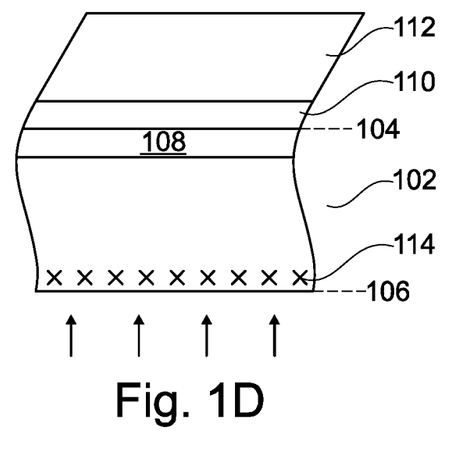

Referring to the schematic cross-sectional view of FIG. 1D, ions 114 are implanted through the second surface 106 into the semiconductor body 102. The ions 114 are ions of a doping element, or ions, which induce doping by complex formation, or ions of a heavy metal.

Figure 1E:
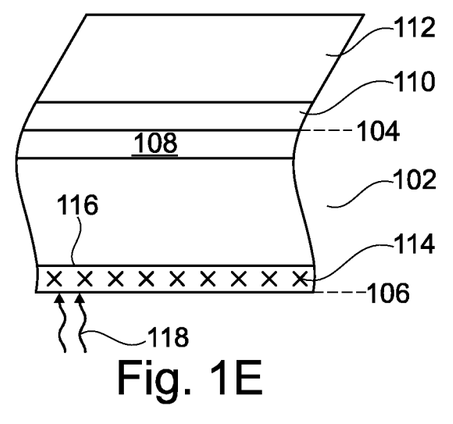

Referring to the schematic cross-sectional FIG. 1E, a surface region 116 of the semiconductor body 102 is irradiated at the second surface 106 with a plurality of laser pulses 118 for electrically activating and adjusting an impurity concentration profile of the implanted ions.

Figure 1F:
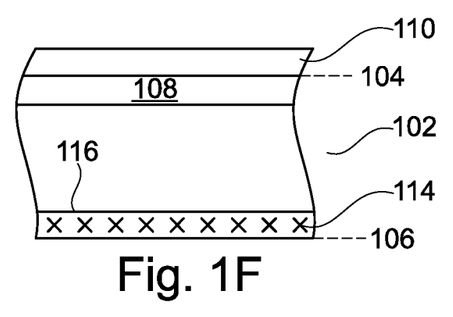

Referring to the schematic cross-sectional FIG. 1F, the carrier 112 is removed from the semiconductor body 102 and may be reused for the process illustrated in FIGS. 1A to 1F or other processes, for example.

Figure 2:
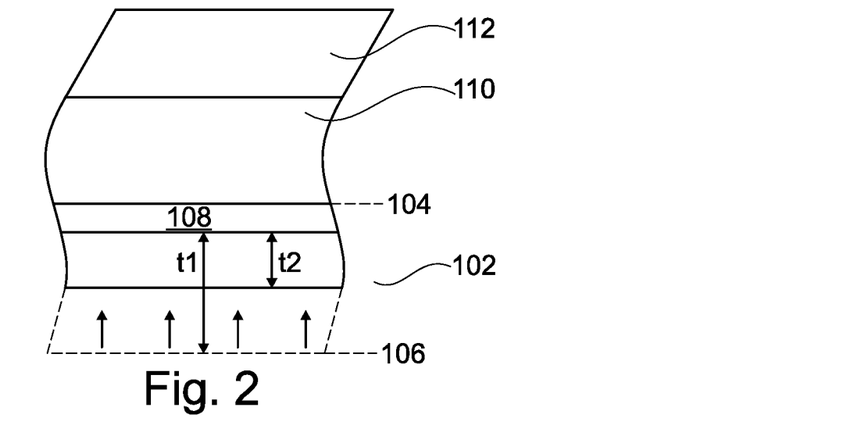
FIGS. 2 to 4 are partial cross-sectional views for illustrating further process features of manufacturing a semiconductor device.

Referring to the schematic cross-sectional view of FIG. 2, a thickness of the semiconductor body 102 may be reduced from a first thickness t1 to a second thickness t2 after attaching the semiconductor body 102 to the carrier 112 (see FIG. 1C) and before implanting the ions 114 through the second surface 106 into the semiconductor body 102.

Figure 3:
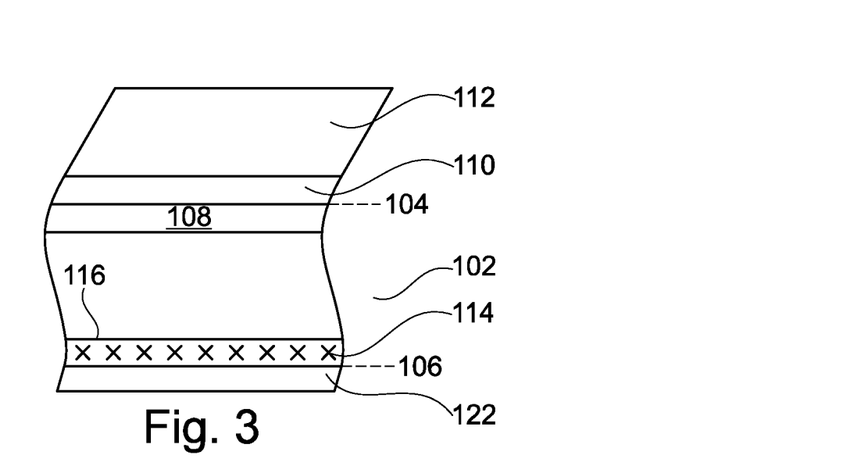

Referring to the schematic cross-sectional view of FIG. 3, a metal contact 122 may be formed on the second surface 106 of the semiconductor body 102 after irradiating the surface region 116 of the semiconductor body 102 at the second surface 106 with the plurality of laser pulses 118 and before removing the carrier 112 from the semiconductor body 102.

Figure 4:
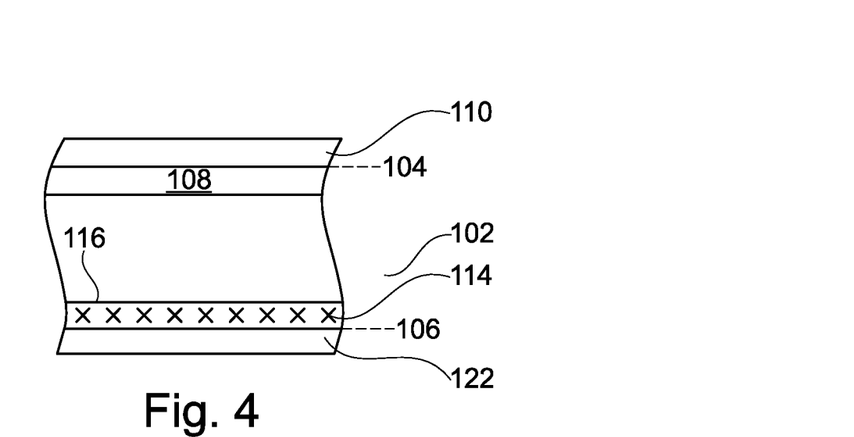

As is illustrated in the schematic cross-sectional view of FIG. 4, the metal contact 122 may also be formed on the second surface 106 of the semiconductor body 102 after removing the carrier 112 from the semiconductor body 102.

Based on the manufacturing methods described in the examples above, impurity concentration profiles at a rear surface of a semiconductor body may be flexibly adjusted.

Figure 5:
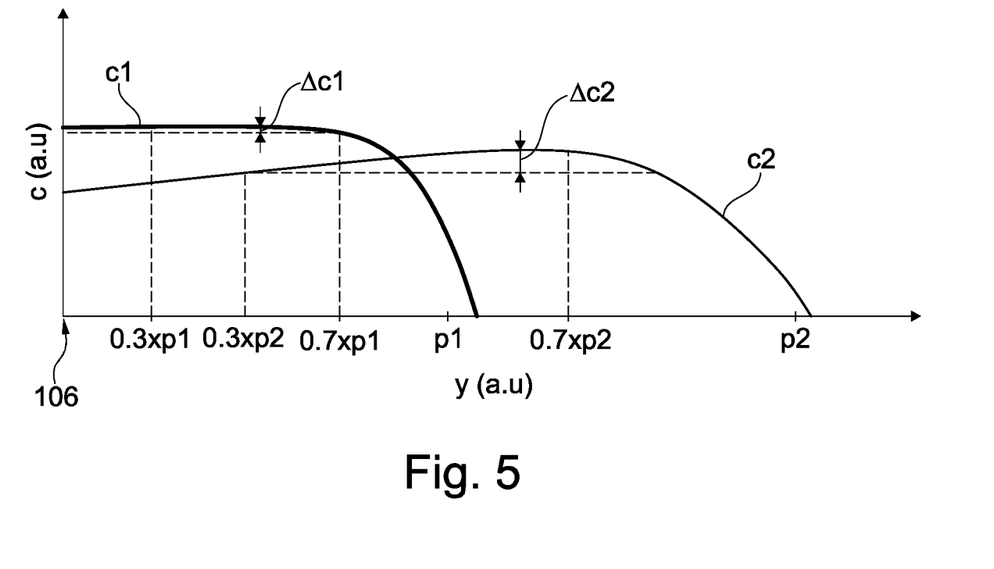
FIGS. 5 and 6 are schematic graphs for illustrating exemplary profiles of concentrations of implanted ions that have been irradiated with laser pulses according the exemplary methods described herein.

In the schematic graph of FIG. 5, exemplary profiles of concentration c1, c2 are depicted versus a vertical direction y starting from the second surface 106 of the semiconductor body 102. The profiles c1, c2 refer to a processing stage after irradiating the semiconductor body with the plurality of laser pulses. For example, the profiles c1, c2 may be determined by characterization techniques such as secondary-ion mass spectrometry, SIMS. The profiles of concentration c1, c2 of the implanted ions after laser pulse irradiation have penetration depths p1, p2 with respect to the second surface 106. Each of the profiles of concentration c1, c2 has a concentration plateau along a vertical segment ranging from 30% to 70% of the penetration depth p1, p2. The plateaus have a fluctuation of the concentration c1, c2 of less than 20%.

Figure 6:
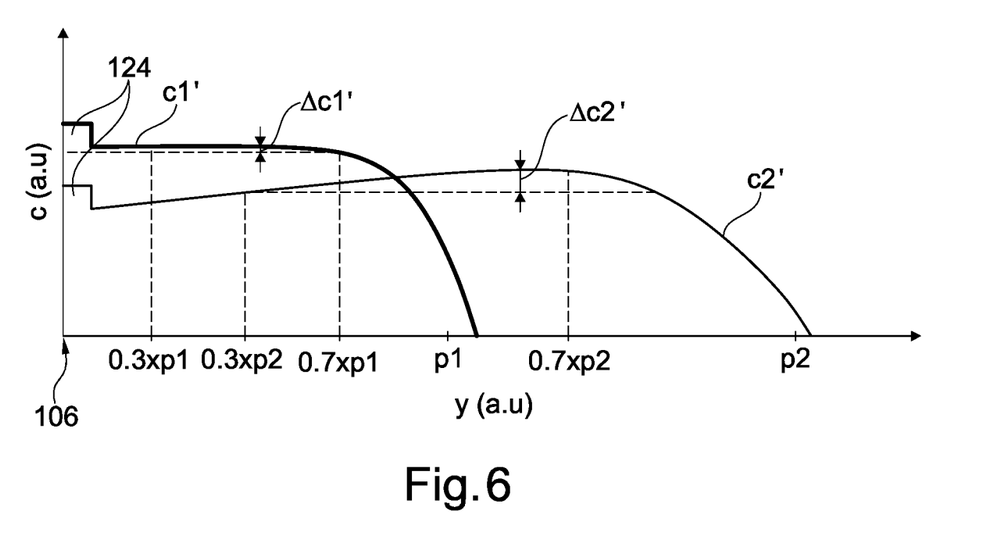

FIG. 6 shows profiles c1' and c2' similar to FIG. 5. The exemplary profiles c1' and c2' of FIG. 6 comprise an additional box-shaped contact region 124 directly at the second surface 106. This additional contact region 124 may comprise a penetration depth of, for example, at most 10% or at most only 5% of the penetration depth p1, p2 of the plateaus.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device in a semiconductor body having a first surface and a second surface, the method comprising:
    forming semiconductor device elements in the semiconductor body by processing the semiconductor body at the first surface;
    forming a wiring area over the first surface of the semiconductor body;
    attaching the semiconductor body to a carrier via the wiring area;
    thereafter:
    implanting ions through the second surface into the semiconductor body, wherein the ions are ions of a doping element, or ions, which induce doping by complex formation, or ions of a heavy metal; and
    irradiating a surface region of the semiconductor body at the second surface with a plurality of laser pulses; and
    thereafter:
    removing the carrier from the semiconductor body.

2. The method of claim 1, further comprising:
    reducing a thickness of the semiconductor body after attaching the semiconductor body to the carrier and before implanting the ions through the second surface into the semiconductor body.

3. The method of claim 1, further comprising:
    forming a metal contact on the second surface of the semiconductor body after irradiating the surface region of the semiconductor body at the second surface with the plurality of laser pulses.

4. The method of claim 1, wherein the ions include protons.

5. The method of claim 1, wherein the ions include at least one of selenium, sulfur, phosphorus, boron, arsenic, aluminum, gallium, and indium.

6. The method of claim 1, wherein the ions include at least one of platinum, palladium, and gold.

7. The method of claim 6, wherein the ions are implanted through the second surface using a patterned ion implantation mask on the second surface.

8. The method of claim 1, wherein the carrier is an organic, inorganic, or hybrid material, and is attached to the semiconductor body via the wiring area by at least one of electrostatic force, adhesive force, or magnetic force.

9. The method of claim 1, wherein the carrier is removed from the semiconductor body by at least one of chemical soaking, chemical dissolving, temperature, electromagnetic radiation, mechanical, magnetic, or electric forces.

10. The method of claim 1, further comprising forming a metal contact on the second surface before removing the carrier from the semiconductor body.

11. The method of claim 1, further comprising forming a metal contact on the second surface after removing the carrier from the semiconductor body.

12. The method of claim 1, wherein the plurality of laser pulses is applied such that thermal equilibrium is not reached in the irradiated semiconductor body during pulse off-mode.

13. The method of claim 1, wherein at least some of the plurality of laser pulses differ by at least one of pulse duration, pulse energy density, and pulse repetition rate.

14. The method of claim 1, wherein a pulse duration of at least some of the plurality of laser pulses ranges from 0.1 ns to 10 ns.

15. The method of claim 1, wherein a pulse energy density of at least some of the plurality of laser pulses ranges from 4 mJ/cm$^2$ to 40 mJ/cm$^2$.

16. The method of claim 1, wherein a pulse repetition rate of at least some of the plurality of laser pulses ranges from 20 MHz to 200 MHz.

17. The method of claim 1, wherein the semiconductor body is a wafer having a diameter equal to or larger than 200 mm, and wherein the method further includes dicing the semiconductor body into dies.

* * * * *